United States Patent [19]

Asano et al.

[11] Patent Number: 4,949,152
[45] Date of Patent: Aug. 14, 1990

[54] SEMICONDUCTOR INTEGRATED CIRCUIT

[75] Inventors: Masamichi Asano, Tokyo; Hiroshi Iwahashi, Yokohama, both of Japan

[73] Assignee: Tokyo Shibaura Denki Kabushiki Kaisha, Kanagawa, Japan

[21] Appl. No.: 818,908

[22] Filed: Jan. 15, 1986

Related U.S. Application Data

[63] Continuation of Ser. No. 558,543, Dec. 2, 1983, abandoned, which is a continuation of Ser. No. 249,639, Mar. 31, 1981, abandoned.

[30] Foreign Application Priority Data

Apr. 24, 1980 [JP] Japan .................... 55-054555

[51] Int. Cl.$^5$ .................. H01L 27/02; H01L 21/70
[52] U.S. Cl. ........................... 357/51; 357/41; 357/30; 357/59; 29/569.1

[56] References Cited

U.S. PATENT DOCUMENTS

| | | | |
|---|---|---|---|
| 3,639,770 | 2/1972 | Zizelmann | 357/75 |
| 3,950,738 | 4/1976 | Hayashi et al. | 357/23 VT X |
| 3,952,325 | 4/1976 | Beale et al. | 357/23 VT |
| 4,271,424 | 6/1981 | Inayoshi et al. | 357/23 |
| 4,291,326 | 9/1981 | Higuchi et al. | 357/84 |
| 4,326,214 | 4/1982 | Trueblood | 357/74 |
| 4,536,941 | 8/1985 | Kuo et al. | 357/84 |

Primary Examiner—Andrew J. James
Assistant Examiner—Viet Q. Nguyen
Attorney, Agent, or Firm—Cushman, Darby, Cushman

[57] ABSTRACT

A semiconductor integrated circuit having a polycrystalline light interrupting layer covering at least one P-N junction. Photo leakage currents produced at the P-N junction by irradiation with light are thus decreased, and malfunctions are prevented.

6 Claims, 7 Drawing Sheets

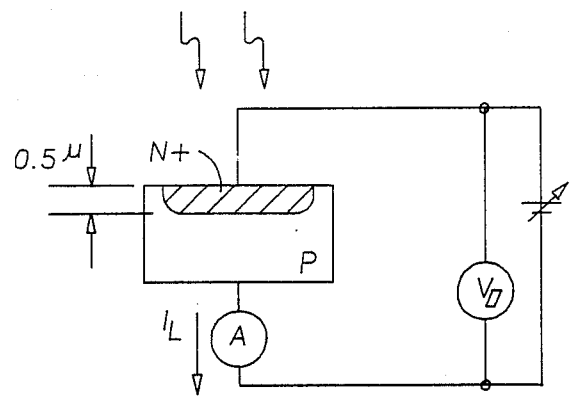
FIG. 3
(PRIOR ART)
FIG. 4
(PRIOR ART)
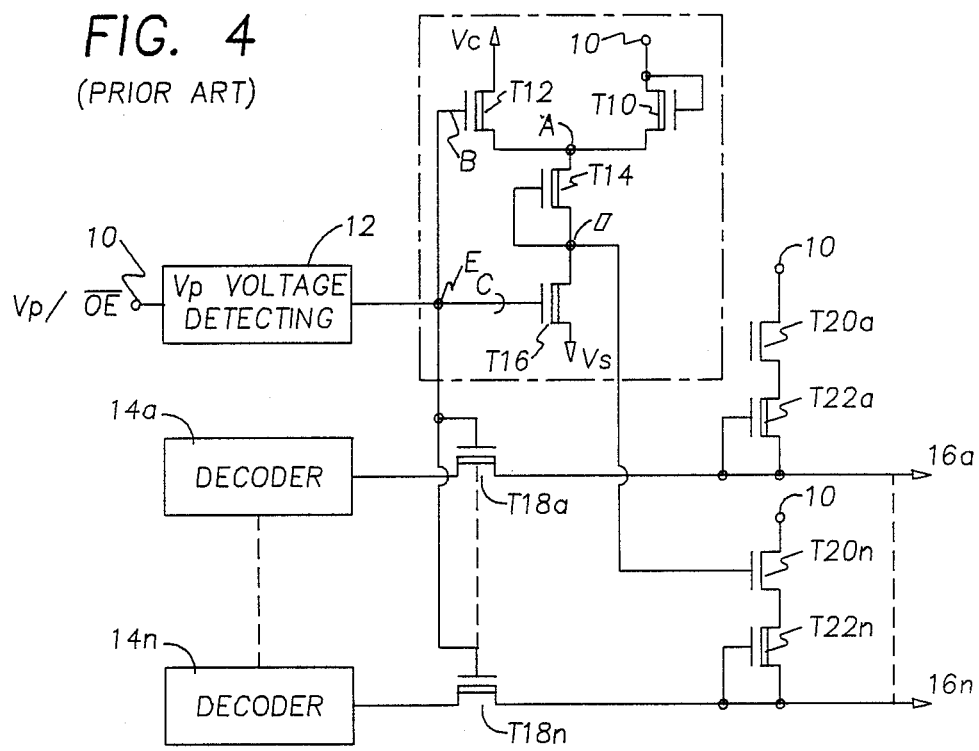

SEMICONDUCTOR INTEGRATED CIRCUIT

This is a continuation of application Ser. No. 558,543, filed Dec. 2, 1983, which was abandoned upon the filing hereof, which is a continuation of Ser. No. 249,639, filed Mar. 31, 1981, which is now abandoned.

BACKGROUND OF THE INVENTION

This invention relates to a semiconductor integrated circuit arrangement in which the photo leakage current caused by incident light is decreased vis-vis conventional arrangements.

The fewer external terminals on an integrated circuit the better FIG. 1 illustrates a prior art circuit which is arranged so as to have a minimum number of external terminals. Terminal 10 is connected to a drain and gate of an enhanced type of MOS transistor T10. A source of transistor T10 is connected to a node A, and node A receives an electric potential $V_c$ through a source and drain of a depletion type MOS transistor T12. Node A is also connected to a node D through a drain and source of a depletion type MOS transistor T14. A gate of transistor T14 is connected to node D, and node D is also connected to an electric potential $V_s$ through a drain and source of an enhancement type MOS transistor T16. Potential Vs is usually the same potential as the semiconductor substrate, for example zero.

A gate terminal B of transistor T12 is maintained at logic "1", namely potential $V_c$ (for example, 5 volts), when terminal 10 receives a signal $\overline{OE}$ which is normally zero. If the potential of node A is $V_c$ and the gate threshold voltage of transistor T10 is $V_{th10}$, transistor T10 is cut off and node A is electrically separated from terminal 10 when the relation $\overline{OE} \leq V_c + V_{th10}$ exists. At this time, a signal having a potential zero or $V_c$ is produced on node D responding to the logic level of gate terminal C of transistor T16.

Gate terminal B shifts into logic state "0" when terminal 10 receives signal $V_p$. If the gate threshold voltage of transistor T12 is $V_{th12}$ and the potential of gate terminal B is $V_{GB}$, transistor T12 is cut off when the relations $V_p - V_{th10} 24 V_{GB} - V_{th12}$ and $V_c \geq V_{GB} - V_{th12}$ are satisfied. As a result, the potential of node D is $V_p - V_{th10}$ when gate terminal C of transistor T16 is at logic "0", and is zero when gate terminal C is at logic "1".

Transistor 10 is operated "on" or "off" responding to the potential differences between node A and terminal 10 in the circuit shown in FIG. 1, and terminal 10 is used as the terminal for two kinds of signals $V_p$ and $\overline{OE}$.

Transistor T10 is cut off when terminal 10 is used as the terminal for signal $\overline{OE}$. Therefore, the fan-out of another circuit connected to terminal 10 is not decreased by the circuit current of node A. In general for a MOS-integrated circuit, the current upper limit of the signal input circuit, namely the current capacity, is nearly ±10 micro amperes (μA). Accordingly, the leakage current from terminal 10 to node A or from node A to terminal 10 should be sufficiently smaller than this current capacity. If transistor T10 is completely cut off, the leakage current must be very small. However, the leakage current cannot be bypassed if light is irradiated on the P-N junction of transistor T10 during its operation.

An ultraviolet ray erasable type EPROM (Erasable Programmable Read Only Memory) is a semiconductor device in which junctions in the integrated circuit are irradiated during operation. EPROMS have been placed in light passing packages having a window provided above the integrated circuit chip for passage of ultraviolet rays. In use, P-N junctions of the integrated circuit including transistor T10 (shown in FIG. 1) receive the light and the junction photo leakage currents produced by the light flow to terminal 10.

FIG. 2 is a graphical representation illustrating the relation between the junction photo leakage current and the illumination of the irradiating light. FIG. 3 illustrates a measuring circuit for FIG. 2. Referring to FIG. 2, the reverse bias voltage $V_D$ of the P-N junction is represented by a solid line of $V_D=8$ volts and a dotted line of $V_D=0$ volts. FIG. 2 illustrates leakage current $I_L$ per light receiving area $\mu m^2$. When the illumination is intense, the total of the leakage current $I_L$ cannot be bypassed in a semiconductor device having a large light receiving area such as an EPROM. For example a 32K bit EPROM has a substantial light receiving area of nearly $1.5 \times 10^5 \mu m^2$. In this case, when the illumination is 3000 lux, photo leakage current $I_L$ is $4 \times 10^{-11} (A/\mu m^2)$, and total leakage currents are $$1.5 \times 10^5 \times 4 \times 10^{-11} = 6 \times 10^{-6}(A) = 6(\mu A)$$

A leakage current of 6 μA cannot be bypassed to the abovementioned current capacity (±10 μA). Consequently, there is the possibility that the circuit will not operate normally if the EPROM is used under a bright light.

FIG. 4 illustrates a partial circuit of the EPROM of FIG. 1. A $V_p$ voltage detecting circuit 12 is used to distinguish whether the input signal of terminal 10 is $V_p$ or $\overline{OE}$, and is constructed as a kind of level comparator. When the potential of terminal 10 is less than $V_c$ (5 volts) a node E is at logic "1"; when it is $V_p$ (25 volts) node E is at logic "0". Node E is connected to the gates of depletion type MOS-transistors T18a to T18n and gate terminals B and C. $V_p$ voltage detecting circuit 12 turns on and off transistors T12, T16 and T18a to T18n responding to the potential of terminal 10. Transistors T18a to T18n are gating transistors inserted between column or row decoders 14a to 14n and decoder output lines 16a to 16n.

Node D is connected to the gates of enhancement type MOS transistors T20a to T20n. All drains of transistors T20a to T20n are connected to terminal 10. Each source of transistors T20a to T20n is connected to decoder output lines 16a to 16n through depletion type MOS-transistors T22a to T22n. The decoder output lines are constructed by 256 lines as columns and 16 lines as rows in the memory cells of 8 bit units and 256 columns and 16 rows. Each decoder output line of 256 and 16 lines is respectively connected to a transistor like one of transistors T20 connected to terminal 10. If the P-N junctions of these many transistors are irradiated, the abovementioned bad influences are caused by the resulting large photo leakage currents.

FIGS. 5(a) to (c) illustrate partial constructions of conventional semiconductor devices. FIGS. 5(a) and (b) illustrate the wiring patterns, namely electric conducting layers 50 on contacting holes 48 of the N+ regions, for example, of drain regions 42. FIG. 5(c) is a section of FIG. 5(a). It is well known to persons skilled in the art that the width of an electric conducting layer 50 has to be narrowed as far as possible to increase integration density. Therefore, most of the P-N junction formed between N+ type drain region 42 and P type substrate 40 is not covered by electric conducting layer 50. Most of the portions of drain region 42 and substrate 40 are covered by SiO₂ film 44 which passes light, so if electric conducting layer 50 is formed of aluminium to block light, most of the P-N junction will not be irradiated.

If photons having energies irradiate drain region 42, the irradiated energy causes valence band electrons to be excited the conduction band. Consequently, photo leakage currents flow to electric conducting layer 50. Photo leakage currents are produced even at the P-N junction into substrate 40 when photon energies are strong. The conventional constructions shown in FIG. 5 produce large photo leakage currents in response to illumination.

OBJECT AND SUMMARY OF THE INVENTION

An object of this invention is to provide an improved semiconductor integrated circuit for preventing the problems caused by photo leakage currents produced by irradiation of the P-N junction.

The semiconductor integrated circuit is in a light passing package according to this invention and includes a light interrupting layer covering P-N junctions which otherwise could be irradiated through the package.

BRIEF DESCRIPTION OF THE DRAWINGS

This and other objects and advantages of the invention will become more apparent and more readily appreciated from the following detailed description of the presently preferred exemplary embodiment of the invention taken in conjunction with the accompanying drawings, of which:

FIG. 3 is a measuring circuit diagram for FIG. 2;

FIG. 4 is a partial circuit diagram of an EPROM developed according to FIG. 1;

FIG. 7(b) is a partial section view of

FIG. 7(a);

DETAILED DESCRIPTION OF THE PREFERRED EMBODIMENT

The semiconductor integrated circuit of this invention is provided with light interrupting layers placed over the P-N junction which can be irradiated to block incident light. As the result, photo leakage currents which are produced by the irradiation of light are substantially decreased. It is especially useful to apply the invention to an EPROM having external connecting terminals connected to other circuits. If an EPROM according to the present invention is used in a bright place, the other circuits connected to it will not be influenced by the leakage currents.

Figure 6A:
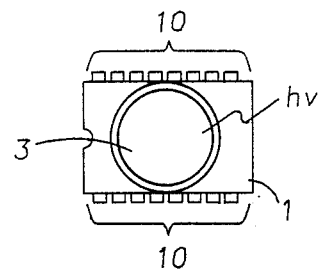
FIGS. 6(a) to (c) are plan, side and elevation views of a package using in this invention.
Figure 6B:
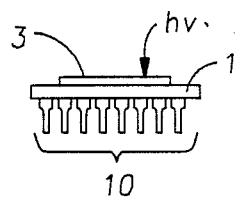
Figure 6C:
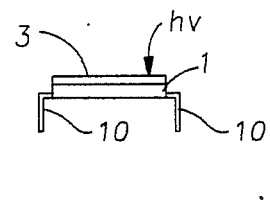

Referring now to the drawings, wherein like reference characters designate like or corresponding parts throughout the several views, FIGS. 6(a) to (c) illustrate outer various views of a package 1 of an EPROM using this invention. A light passing window 3 is provided on the upper surface of package 1, and is used to erase the data stored in memory cells of the EPROM by photons or ultraviolet rays having energies hv. It is preferable that all of package 1 be transparent.

Figure 1:
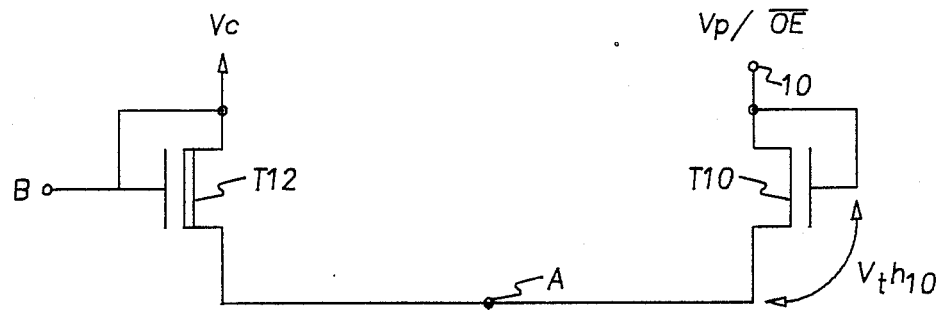
FIG. 1 is a conventional circuit diagram with minimal external terminals.
Figure 7A:
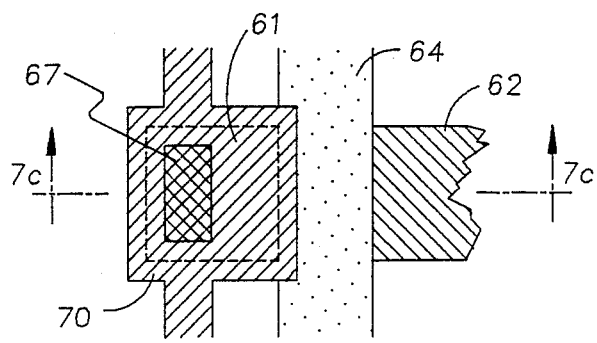
FIG. 7(a) is a plan view of an embodiment of this invention.
Figure 7B:
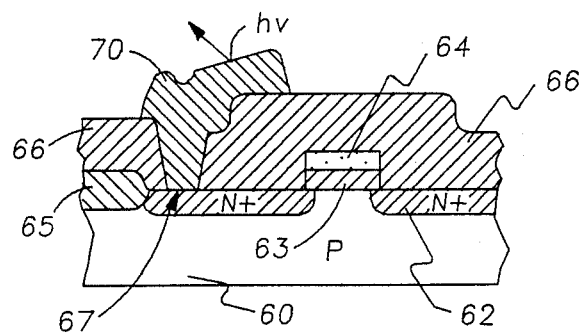
Figure 7C:
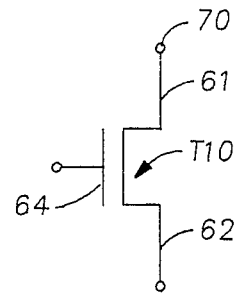
FIG. 7(c) is an equivalent circuit diagram of FIGS. 7(a) and (b)

FIGS. 7 illustrate an embodiment of this invention. FIG. 7(a) is a plan view, FIG. 7(b) is a section view and FIG. 7(c) is an equivalent circuit diagram. N⁺ type drain region 61 and source region 62 are formed by diffusion on the surface of P type substrate 60. A polycrystalline silicon gate film 64 is formed above the channel region over a gate oxide film 63, for example SiO₂. A field oxide film 65, for example SiO₂, is formed outside of N⁺ regions 61 and 62. An insulating film 66, for example SiO₂, covers the surfaces of field oxide film 65 and polycrystalline silicon gate film 64. A contact hole 67 is formed in drain region 61, and an electric conducting layer 70, for example aluminium, is formed in contact hole 67 and on its side surfaces. Electric conducting layer 70 is connected for example to terminal 10 (shown in FIG. 1).

Figure 2:
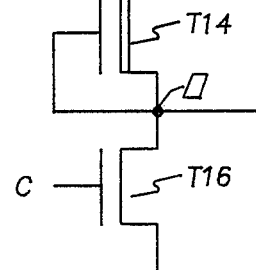
FIG. 2 is a graphical representation showing relation of the leakage current to illumination.
Figure 2:
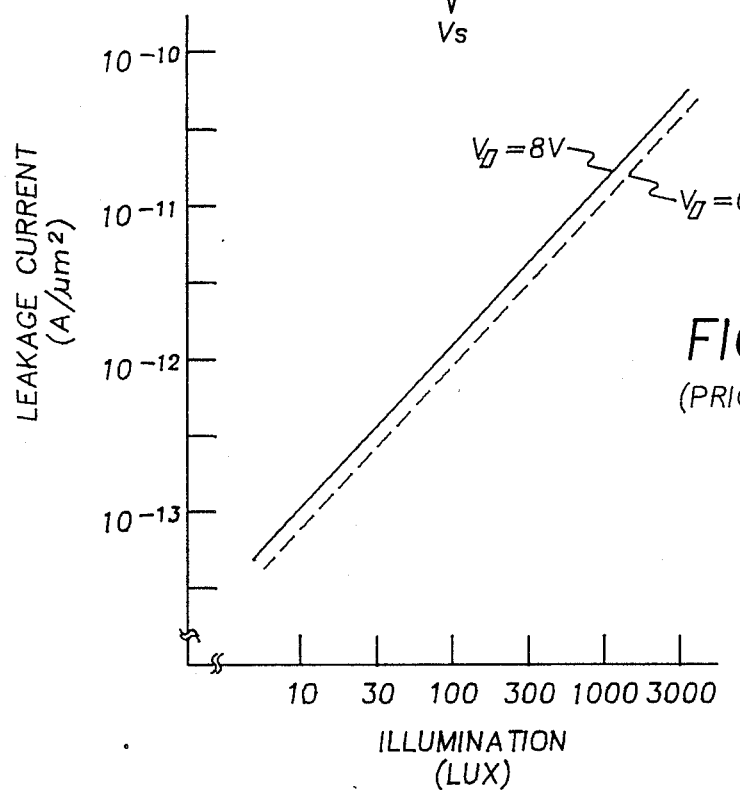
Figure 5A:
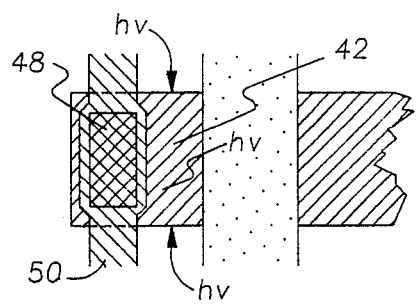
FIGS. 5(a) and (b) are plan views of conventional devices.
Figure 5B:
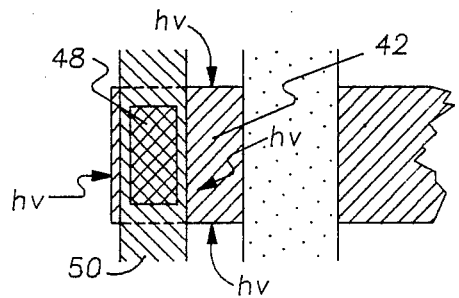
FIG. 5(c) is a partial section view of FIG. 5(a)
Figure 5C:
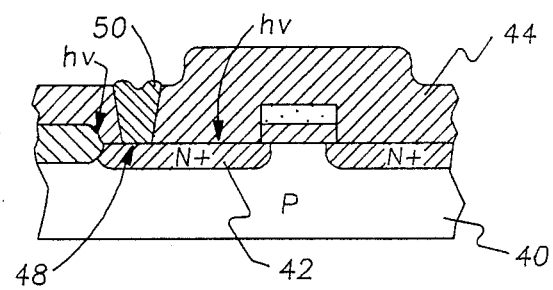

Electric conducting layer 70 covers the P-N junction formed between substrate 60 and drain region 61, and blocks the irradiation of the P-N junction. If the illumination at the P-N junction decreases the leakage currents also decrease as shown in FIG. 2. Namely, electric conducting layer 70 works as a light interrupting layer to decrease the photo leakage current produced by the light.

Figure 8A:
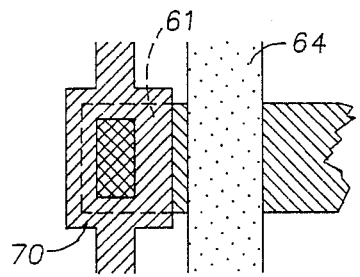
FIGS. 8(a) to (e) are plan views showing various modifications of FIG. 7.

FIGS. 8(a) to (e) are plan views showing various modifications of FIG. 7. In FIG. 7(a), electric conducting layer 70 and polycrystalline silicon gate film 64 overlap each other to completely block the light from reaching the P-N junction. Sometimes for design reasons, an overlap must be avoided, for example if the capacitance must not be decreased. In this case, conducting layer 70 is separated from gate film 64 as shown in FIG. 8(a). For example, in the above case when the MOS transistor including drain region 61 is a part of a switching circuit and the circuit impedance of gate 64 is high, the construction shown in FIG. 8(a) is useful when the switching speed is dropped by the Miller effect caused by the capacitance between gate film 64 and drain region 61. This effect is discussed in IEEE TRANSACTIONS ON ELECTRIC DEVICES, VOL. ED-25, 3, MARCH 1978, P. 369-374. Conducting layer 70 and gate film 64 may just contact each other (not shown).

Figure 8B:
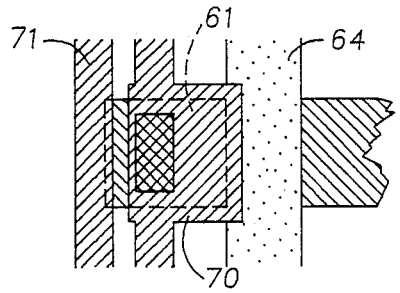

FIG. 8(b) illustrates the case in which another electric conducting layer 71 is used as an additional light interrupting layer. Both conducting layers 70 and 71 block light. This case is useful when both conducting layers 70 and 71 have to lay close to each other.

Figure 8C:
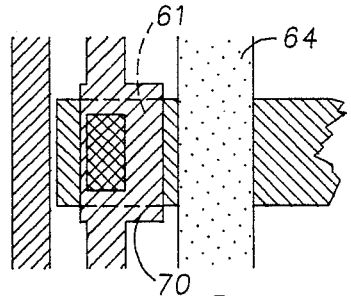

FIG. 8(c) illustrates a construction in which conducting layer 70 does not contact gate film 64 and another conducting layer 71 decreases the capacitance.

Figure 8D:
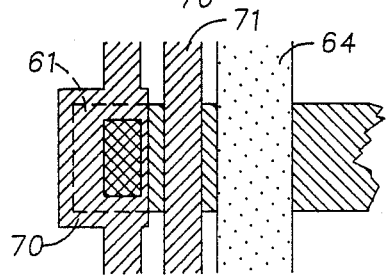
Figure 8E:
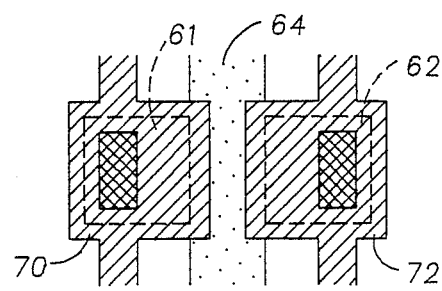

In FIG. 8(d), another electric conducting layer 71 is provided between electric conducting layer 70 and gate film 64. In FIG. 8(e), drain and source regions 61 and 62 are protected by two conducting layers 70 and 72. This arrangement is useful when for example the MOS transistor is constructed as a transfer gate circuit and two conducting layer 70 and 72 are connected to independent terminals 10 respectively.

Figure 9A:
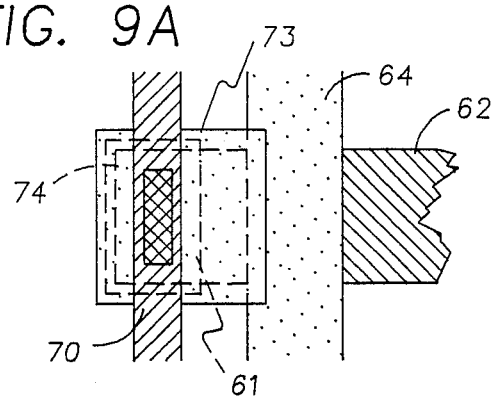
FIG. 9(a) is a plan view of a preferred embodiment of this invention.
Figure 9B:
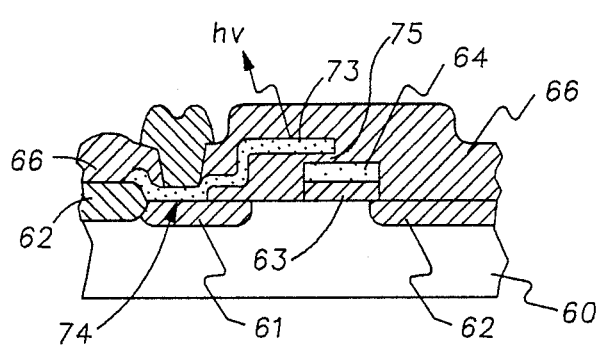
FIG. 9(b) is a partial section view of FIG. 9(a)
Figure 9C:
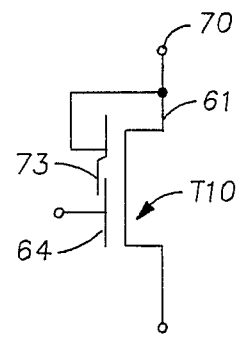
FIG. 9(c) is an equivalent circuit diagram of FIGS. 9(a) and (b)

FIGS. 9 illustrate another embodiment of this invention in which a polycrystalline silicon film 73 is formed on drain region 61. Polycrystalline silicon film 73 is used as the electric connection between contact hole 74 and electric conducting layer 70, and covers the P-N junction formed between drain region 61 and substrate 60. Film 73 overlaps a part of gate film 64 through a gate oxide film 75 to block light from entering FIG. 9(c) is an equivalent circuit diagram of FIGS. 9(a) and (b).

Figure 10:
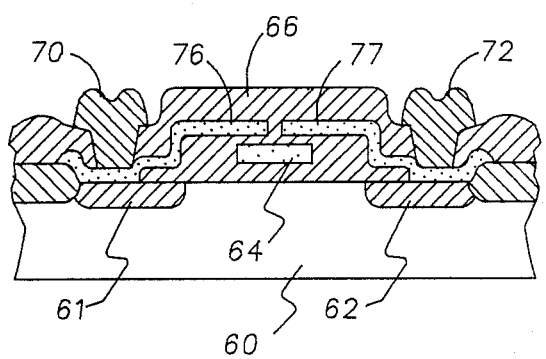
FIG. 10 is a partial section view showing various modification of FIG. 9.

FIG. 10 illustrates a modification of FIGS. 9, and corresponds to FIG. 8(e). Two polycrystalline silicon films 76 and 77 cover drain and source regions 61 and 62 respectively to block the light.

Figure 11:
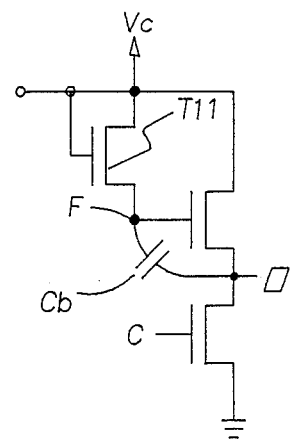
FIG. 11 is another circuit diagram applicable to this invention.

FIG. 11 illustrates another circuit applicable to this invention. This circuit is a bootstrap circuit for providing higher voltage than drain voltage $V_c$ at node F. If the light is irradiated on the P-N junction formed between the N+ type region and the P type substrate connected to node F, misoperation occurs because electric charges stored in bootstrap capacitance $C_b$ are quickly discharged by the photo currents, and the potential of node F drops. However, this misoperation is prevented by the constructions shown in FIGS. 7 or 9.

Figure 12A:
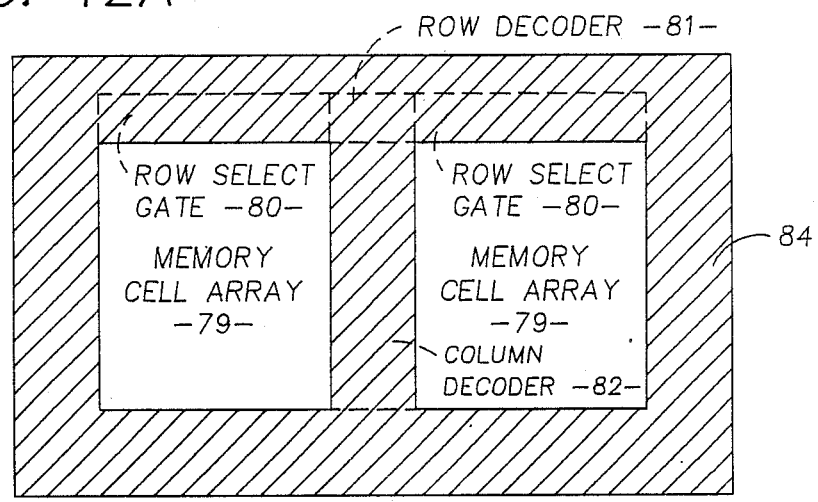
FIG. 12(a) is a plan view of another preferred embodiment of this invention.
Figure 12B:
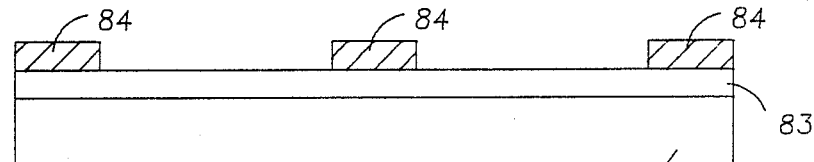
FIG. 12(b) is a partial section view of FIG. 12(a)
Figure 12C:
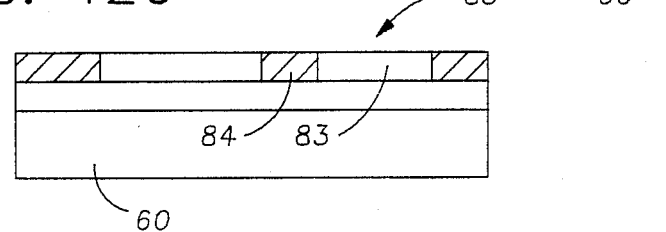
FIG. 12(c) is a partial section view showing various modifications of FIG. 12(b)

FIGS. 12 illustrate another preferred embodiment of this invention. Memory arrays 79 in EPROM chip 68 cannot block light but row selecting gates 80, row decoders 81 and column decoders 82 etc. can block the light. In FIG. 12(a), total light interruption is used instead of interruptions of individual transistors shown in FIGS. 7 and 9. A chip protecting film 83 is formed on the surface of substrate 60, and a light interrupting layer 84 is formed thereon. Chip protecting film 83 can be PSG (Phosphor Silicate Glass) film or $SI_3N_4$ film, and light blocking film 84 can be metal film, epoxy resin film or other opaque material. Film, 83 and layer 84 are formed by evaporation or sputtering. Protecting film 83 and interrupting layer 84 can be replaced for common use by another layer 85 which is produced by permeating selectively the interruption atoms (or molecules) into protecting film 83 through a mask.

Figure 13A:
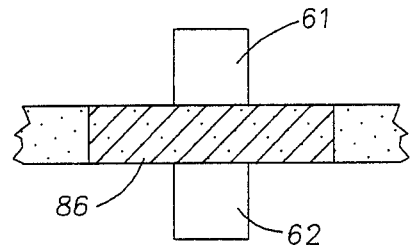
FIG. 13(a) is a plan view of a memory cell used in the memory arrays shown in FIG. 12(a)
Figure 13B:
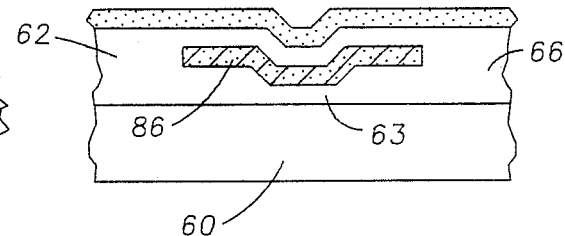
FIG. 13(b) is a section view of FIG. 13(a).

FIGS. 13 illustrate memory cells used in the memory arrays shown in FIG. 12. Electrons are stored corresponding to the data "0" in a floating gate 86 by impact ionization. Ultraviolet rays are used to erase all arrays when the contents of memory cells have to be altered to the data "1" state, but areas except memory cell array portion are covered by interrupting layer 84 (shown in FIGS. 12).

The abovementioned embodiments block the light entering from outside the integrated circuit vessel. However this invention is applicable to another type of integrated circuit which has a light emitting source, for example a light emitting diode or a photo coupler, in the opaque vessel of the integrated circuit. This invention is not limited only to P-N junctions included in MOS transistors, but is also useful to protecting other junctions, for example, bipolar transistors or thyristors.

In the above-mentioned embodiments of this invention, the P-N junctions exposed to the light are protected from the light so that the photo leakage currents are decreased and it is possible to prevent malfunctions caused by the photo leakage currents.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims.

What is claimed is:
1. A semiconductor integrated circuit comprising:
   (a) a substrate of a first conductivity type;
   (b) first and second regions of a second conductivity type forming first and second P-N junctions with said substrate;
   (c) a gate electrode having a portion separated from said first region and partially overlapping with said second region through an insulating layer;
   (d) light interrupting means, made from a polycrystalline layer, connected to said first region, for preventing light from irradiating said first P-N junction, said polycrystalline layer being provided over substantially the entire first P-N junction and having a portion electrode through said insulating layer, and
   (e) an aluminum electrode connected to the light interrupting means only at one portion thereof and on the first region.

2. A semiconductor integrated circuit as in claim 1, wherein said integrated circuit is included in a semiconductor chip packaged into a light passing package.

3. A semiconductor integrated circuit as in claim 1, wherein said integrated circuit is included in a semiconductor chip packaged into a package which has a light emitting element.

4. A semiconductor integrated circuit according to claim 1 wherein the light interrupting means is made from polycrystalline silicon film.

5. A semiconductor integrated circuit comprising:
   (a) a substrate of a first conductivity type;
   (b) first and second regions of a second conductivity type forming P-N junctions with said substrate;
   (c) a gate electrode, having a portion separated from said first region and said second region through an insulating layer;
   (d) a light interrupting means made from polycrystalline material, connected to said first region for preventing light from irradiating the P-N junctions, said polycrystalline material being provided over substantially the whole of the P-N junctions formed between the first and second regions and the substrate and extending from said respective first and second regions to cover a substantial portion of the gate electrode; and
   (e) first and second aluminum electrodes connected to the interrupting means only at one portion on the first and second regions respectively.

6. A semiconductor integrated circuit according to claim 5 wherein the light interrupting means is made from polycrystalline silicon film.

* * * * *